(12) United States Patent
Yamada et al.

(10) Patent No.: US 6,499,217 B1
(45) Date of Patent: Dec. 31, 2002

(54) METHOD OF MANUFACTURING THREE-DIMENSIONAL PRINTED WIRING BOARD

(75) Inventors: Shingetsu Yamada, Tokyo (JP); Jun Takagi, Tokyo (JP); Koichiro Taniguchi, Tokyo (JP); Kaoru Nomoto, Aichi (JP); Toshihiro Miyake, Aichi (JP); Kazuya Sanada, Aichi (JP); Makoto Totani, Aichi (JP)

(73) Assignees: Mitsubishi Plastics Inc., Tokyo (JP); Denso Corporation, Aichi (JP)

( * ) Notice: Subject to any disclaimer, the term of this patent is extended or adjusted under 35 U.S.C. 154(b) by 0 days.

(21) Appl. No.: 09/700,992

(22) PCT Filed: Mar. 24, 2000

(86) PCT No.: PCT/JP00/01841

§ 371 (c)(1),
(2), (4) Date: Feb. 6, 2000

(87) PCT Pub. No.: WO00/59274

PCT Pub. Date: Oct. 5, 2000

(30) Foreign Application Priority Data

Mar. 26, 1999 (JP) ............................................. 11-084278

(51) Int. Cl.$^7$ ................................................. H01K 3/22
(52) U.S. Cl. ............................. 29/848; 29/846; 29/847
(58) Field of Search ........................... 29/846, 847, 848

(56) References Cited

FOREIGN PATENT DOCUMENTS

| JP | 62-52993 | 3/1987 |
| JP | 62280018 A | * 12/1987 |
| JP | 3-35584 | 2/1991 |
| JP | 4-43029 | 2/1992 |
| JP | 5-226804 | 9/1993 |

* cited by examiner

Primary Examiner—F. Daniel Lopez
Assistant Examiner—Kimya N. McCoy
(74) Attorney, Agent, or Firm—Wenderoth, Lind & Ponack, L.L.P.

(57) ABSTRACT

An efficient method of manufacturing a three-dimensional printed wiring board is provided in which a conductor foil can be reliably heat-fused to the board at a relatively low temperature and the three-dimensional shape such as convex and concave of a mold can be reproduced precisely with no residual stress.

The method comprises the steps of providing a filmy insulator comprising a thermoplastic resin composition containing 65–35 wt % of a polyaryl ketone resin having a crystal-melting peak temperature of 260° C. or over, and 35–65 wt % of an amorphous polyetherimide resin, and having a glass transition temperature as measured when the temperature is increased for differential scanning calorie measurement of 150–230° C. superposing a conductor foil on one or both sides of the filmy insulating member, heat-fusing the conductor foil so that the thermoplastic resin composition will satisfy the relation between the crystal-melting calorie Δ Hm and the crystallizing calorie Δ Hc as expressed by the following formula (I), etching the conductor foil to form a conductor circuit, and deforming the printed wiring circuit obtained three-dimensionally.

$$[(\Delta Hm - \Delta Hc)/\Delta Hm] \leq 0.5 \quad \text{(I):}$$

$$[(\Delta Hm - \Delta Hc)/\Delta Hm] \geq 0.7 \quad \text{(II):}$$

6 Claims, 3 Drawing Sheets

METHOD OF MANUFACTURING THREE-DIMENSIONAL PRINTED WIRING BOARD

TECHNICAL FIELD OF THE INVENTION

This invention relates to a method of manufacturing a three-dimensional printed wiring board, and more particularly a method of manufacturing a three-dimensional printed wiring board having an insulating layer formed from a thermoplastic resin.

PRIOR ART

As a rigid board in which a conductor circuit is formed on one or both sides of a prepreg formed from glass cloth impregnated with an epoxy resin, a three-dimensional printed wiring board formed with a recess for housing pin and ball grids and LEDs is known. Such three-dimensional printed wiring boards are sometimes called PGA (pin-grid arrays) boards or BGA (ball-grid arrays) boards.

As shown in FIG. 5, in order to manufacture a three-dimensional printed wiring board 12 by forming a recess 11 in a rigid board 10, a male mold 13 of a predetermined shape in the form of a round or polygonal column called a punching mold is pressed against an intended area for mounting parts on the front surface of a rigid board 10, a female mold 14 called a die mold is pressed against the back of the rigid board 10, the rigid board is sandwiched between both molds for hot-pressing to form recesses 11 at required places on the rigid board 10 to make the printed wiring board three-dimensional.

Also, as shown in FIG. 6, another method is known in which cutting work called countersinking is done on the front surface of a rigid board 15 to form a recess 16 in an intended area for mounting parts to make the printed wiring board three-dimensional.

As a material for an insulating board of a three-dimensional printed wiring board, a thermoplastic saturated polyester resin is known. A manufacturing method in which during a step of crystallizing such a thermoplastic resin, an insulating board is hot-pressed into a predetermined bent or drawn shape is disclosed in Japanese patent publications 6-93536 and 7-101772.

Problems the Invention Tackles

But in manufacturing a three-dimensional wiring board using a thermoplastic saturated polyester resin for the material of an insulating board, there is a problem that the insulating board deforms around a conductor pattern during hot-pressing, and a force (residual stress) that tends to restore the deformed body to the original state acts on the deformed body. In an extreme case, deformation called "waving" is locally caused.

Also, in manufacturing a conventional three-dimensional printed wiring board using a glass epoxy resin, control of the degree of crosslinking of the epoxy resin to the step of hot-press forming is difficult, so that it is impossible to manufacture satisfactory products in reliability and mass-productivity. Also, for a printed wiring board reinforced with glass cloth, its use is limited because of low flexibility.

Also another problem is that if a three-dimensional printed wiring board for mounting of parts for which soldering heat resistance is required or a three-dimensional printed wiring board for mere electric wiring is subjected to bending, a bending stress acts on a conductor of copper or aluminum rather than on an insulating board made from a resin that is low in elasticity, so that the conductor is liable to be cut.

Furthermore, with a conventional polyimide-family board material, heat-fusing a conductor foil reliably at a relatively low temperature is not an easy thing.

An object of this invention is to solve the above-mentioned problems and provide a strain-free three-dimensional printed wiring board by eliminating residual stresses from the wiring board that has been hot-pressed to make it three-dimensional in the manufacture of three-dimensional printed wiring board using a thermoplastic resin that has a good heat resistance.

Also, another object of this invention is to make it possible to reliably heat-fuse a conductor foil to a polyimide resin board at a relatively low temperature, and also to provide a method of manufacturing a three-dimensional printed wiring board in which an intended three-dimensional shape can be accurately formed by hot-pressing at a relatively low temperature, and to provide a three-dimensional printed wiring board that also has soldering heat resistance and chemical resistance.

A still another object of this invention is to provide a three-dimensional printed wiring board in which conductors are less likely to be cut even if bending work is done after a conductor circuit has been formed.

Means to Solve the Problems

In order to solve the above objects, according to this invention, there is provided a method of manufacturing a three-dimensional printed wiring board, the method comprising the steps of providing a filmy insulator comprising a thermoplastic resin composition containing 65–35 wt % of a polyaryl ketone resin having a crystal-melting peak temperature of 260° C. or over, and 35–65 wt % of an amorphous polyetherimide resin, and having a glass transition temperature as measured when the temperature is increased for differential scanning calorie measurement of 150–230° C., superposing a conductor foil on one or both sides of the filmy insulator, heat-fusing the conductor foil so that the thermoplastic resin composition will satisfy the relation between the crystal-melting calorie Δ Hm and the crystallizing calorie Δ Hc as expressed by the following formula (I), etching the conductor foil to form a conductor circuit, and deforming the printed wiring circuit obtained three-dimensionally.

$$[(\Delta Hm - \Delta Hc)/\Delta Hm] \leq 0.5 \tag{I:}$$

If a protective film is provided so as to cover the conductor circuit before deforming such a printed wiring board three-dimensionally, bending stress will not concentrate on the conductor circuit, so that it is possible to manufacture a three-dimensional printed wiring board having a conductor circuit which is less likely to be cut.

In order to impart soldering heat resistance to the filmy insulator, in the above-described method, the printed wiring board formed with a conductor circuit is subjected to heat treatment so that the thermoplastic resin composition will satisfy the relation expressed by the following formula (II):

$$[(\Delta Hm - \Delta Hc)/\Delta Hm] \geq 0.7 \tag{II:}$$

As the heat treatment, hot-press forming may be employed.

As the conductor foil to be laminated on one or both sides of the filmy insulator, a conductor foil having its surface roughened is preferably employed. As the polyaryl ketone resin, a polyetherether ketone resin is preferable.

In the method of manufacturing the three-dimensional printed wiring board of this invention, an insulating layer is formed which comprises a filmy insulator which contains predetermined amounts of a crystalline polyaryl ketone resin and an amorphous polyether imide resin. Due to excellent properties of these resins, the insulating layer has heat-fusability and soldering heat resistance, and also has flexibility, mechanical strength and electrical insulating properties normally required for a printed wiring board.

The thermoplastic resin composition after a conductive foil has been heat-fused satisfies the relation expressed by the formula (I), has a glass transition temperature of 150–230° C., and the crystal-melting calorie Δ Hm and the crystallizing calorie Δ Hc produced by crystallization while the temperature is being increased satisfies the relation expressed by the formula (I). The progression of crystallization of the polyaryl ketone resin due to heating is adjusted within a suitable range.

The conductor foil heat-fused to one or both sides of the filmy insulator is strongly bonded due to the heat-fusability of the thermoplastic resin composition, so that a precision conductor circuit formed by etching the conductor foil is also strongly bonded and less likely to peel off. The use of a conductor foil having its surface roughened is preferable because the bond strength between the conductor circuit and the insulating layer increases.

In order to three-dimensionally deform the printed wiring board formed with a conductor circuit, bending work by external force or hot-press forming may be employed.

If hot-press forming is carried out to make it three-dimensional, with a protrusion pressed on a predetermined portion of the surface of the printed wiring board formed with a conductor circuit, a relatively low temperature of 250° C. or lower, usually around 230° C. may be employed for hot-pressing. At this time, if the relation expressed by the formula (I) is met, the thermoplastic resin will exceed the glass transition temperature (Tg), so that it is possible to locally form recesses with high accuracy.

The thermoplastic resin composition of the insulating layer of the three-dimensional printed wiring board thus manufactured exhibits crystallizability expressed by the above formula (II). This wiring board has a sufficient soldering heat resistance to withstand 260° C. Also, the protrusions and recesses of the mold are precisely reproduced, so that a three-dimensional printed circuit board is manufactured which can reliably accommodate parts to be mounted.

As for the bonding between the filmy insulator and the conductor foil, since they are heat-fused together without any adhesive such as expoxy resin between layers, various properties such as heat resistance, chemical resistance and electrical properties are not governed by the properties of an adhesive. Thus it is possible to make best use of various excellent properties of the insulating layer.

Also, since the application of an adhesive or cutting work to form recesses is not needed during the manufacturing steps, the manufacturing process is simplified. This provides an efficient manufacturing method of a three-dimensional printed wiring board.

EMBODIMENTS

The first embodiment of the method of manufacturing a three-dimensional printed wiring board of this invention will be described with reference to FIG. 1.

Figure 1A:
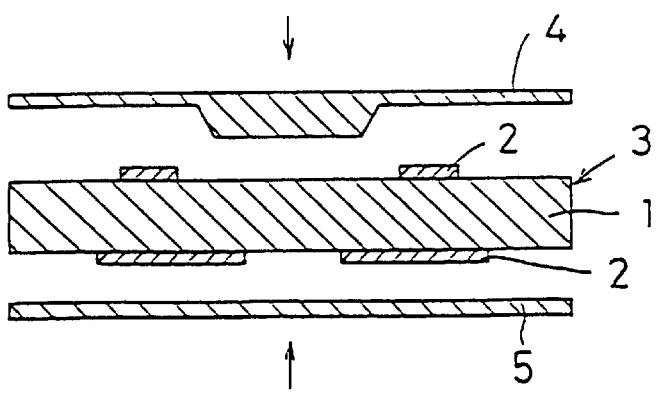
FIG. 1 is a schematic view showing manufacturing steps of a three-dimensional printed wiring board of a first embodiment.

The insulating layer (or filmy insulator) 1 of the printed wiring board shown in FIG. 1(a) is formed of a thermoplastic resin composition containing 65–35 wt % of a polyaryl ketone resin having a crystal-melting peak temperature of 260° C. or over and 35–65 wt % of an amorphous polyetherimide resin, and having a glass transition temperature as measured when the temperature is increased for differential scanning calorie measurement of 150–230° C.

In order to manufacture such a printed wiring board, a polyaryl ketone resin and an amorphous polyether imide resin are added in the above ratio to prepare a predetermined crystalline thermoplastic filmy insulator which will be described below.

Then a copper foil is superposed on one or both sides of the filmy insulator 1 and hot-pressed using e.g. a vacuum hot press to manufacture a double-side-copper-clad laminated board to which copper foils are heat-fused.

In the hot-press step, it is heated so as to exceed the glass transition point of the thermoplastic resin composition but not to exceed the crystallizing temperature of the thermoplastic resin. While keeping the amorphous state of the thermoplastic resin composition, it is heated to heat-fuse copper foils to both sides of the filmy insulator 1. Thereby, a copper-clad laminated board is formed in which the thermoplastic resin composition satisfies the relation expressed by the following formula (I). The pressure during pressing for bonding of the copper foils is preferably 10–100 kgf/cm², more preferably 30–50 kgf/cm².

$$[(\Delta Hm - \Delta Hc)/\Delta Hm] \leq 0.5 \tag{I:}$$

Next, conductor circuits 2 are formed by etching the copper foils using the subtractive method to obtain a printed wiring board 3 shown in FIG. 1(a).

Figure 1B:
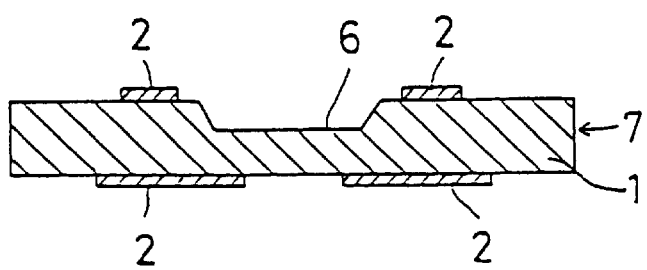

A hard convex plate 4 of stainless steel formed with a protrusion is superposed on one side (top in the figure) of the printed wiring board 3. Also, a hard flat plate 5 of stainless steel is superposed on the other side (bottom in the figure). In this state, it is hot-pressed. The forming conditions should be such that the thermoplastic resin composition forming the filmy insulator 1 will satisfy the relation expressed by the below-described formula (II). In this way, a three-dimensional wiring board 7 formed with a recess 6 of a predetermined shape for mounting parts as shown in FIG. 1(b) is manufactured.

Hot-press forming for forming the recess 6 at a required area of the printed wiring board 7 is carried out by heating it to around the crystal-melting peak temperature (Tc) of the thermoplastic resin composition (e.g. 220–250° C.) and accelerating crystallization to manufacture a three-dimensional printed wiring board that is resistant to soldering heat. The pressure during hot-pressing to make it three-dimensional is preferably 10–100 kgf/cm² and more preferably 30–50 kgf/cm².

Instead of the hard flat plate 5, if a hard convex plate (not shown) formed with a protrusion at a required portion is used, it is possible to manufacture a three-dimensional printed wiring board formed with recesses 6 on both sides of the printed wiring board 3.

Also, instead of the hard convex plate 4, if a plate formed with recesses and protrusions on both sides is used, it is possible to form recesses and protrusions on both sides of the printed wiring board.

For a printed wiring board formed with conductor circuits, any other means for making it three-dimensional than hot-pressing may be employed and later, if soldering heat resistance is required, heat treatment may be carried out.

Figure 2:
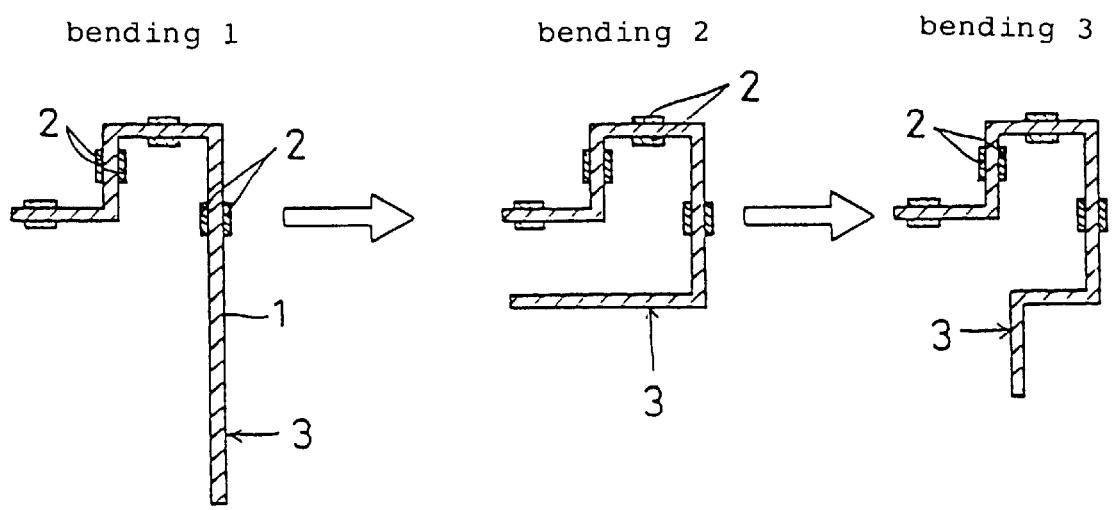
FIG. 2 is an explanatory view of bending work for a three-dimensional printed wiring board of a second embodiment.

The second embodiment shown in FIG. 2 relates to a method of manufacturing a three-dimensional printed wiring board by employing known bending work as a means for making it three-dimensional other than hot-pressing.

For example, for a printed wiring board 3 formed with conductor circuits 2 on one or both sides of insulating layer (filmy insulator) 1, as shown in FIG. 2, [bending work 1] is performed first, and then [bending work 2] is performed to increase bent portions, and further [bending work 3] is performed to finish it to a final shape. Then, if soldering heat resistance is required, it is subjected to heat treatment so that the thermoplastic resin composition will satisfy the relation expressed by the formula (II). If heat treatment is carried out before [bending work 1] or [bending work 2], crystallizability of the insulating layer 1 will be so high that it is difficult to carry out bending work thereafter.

If the application of the three-dimensional wiring board bent to a final shape is for connection cables or mere electric wiring and thus no soldering heat resistance is required, the heat treatment that satisfies the relation expressed by formula (II) may be omitted.

Figure 3A:
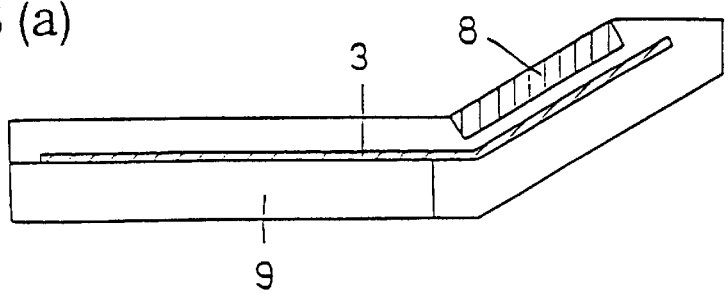
FIG. 3(a) is a partially sectional side view showing a schematic structure of a cellular phone on which is mounted the three-dimensional printed wiring board of the embodiment.
Figure 3B:
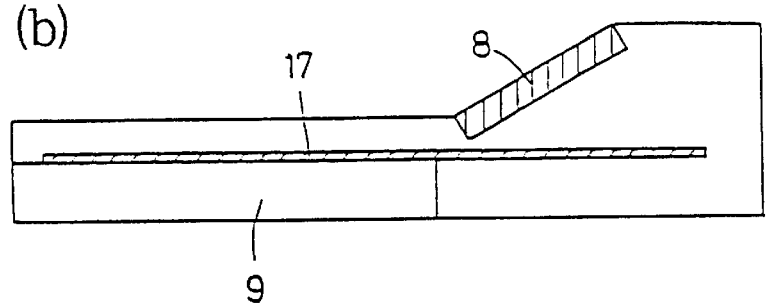
FIG. 3(b) is a partially sectional side view showing a schematic structure of a cellular phone on which is mounted a conventional printed wiring board.

With a conventional cellular phone as shown in FIG. 3(b), there is a problem that since a printed wiring plate is difficult to bend, unused space remains in the back of the display 8. But as shown in FIG. 3(a), a bent three-dimensional printed wiring board can be arranged along a display 8 inclined in a thin cellular phone and a battery housing 9. Such a bent three-dimensional printed wiring board can be set in a small-volume space in which even a flexible printed wiring board cannot be housed.

Also, a protective film formed before the printed wiring board is three-dimensionally deformed may be formed from the same resin composition as the filmy insulator in which polyaryl ketone and amorphous polyether imide resins are mixed at a predetermined rate, or may be of the same material as an ordinary cover film for a printed wiring board.

With a printed wiring board provided with a cover film, stress on the conductor circuits when the printed wiring board is in a bent state is relaxed. Thus cutting of wires is less likely to occur.

Figure 4:
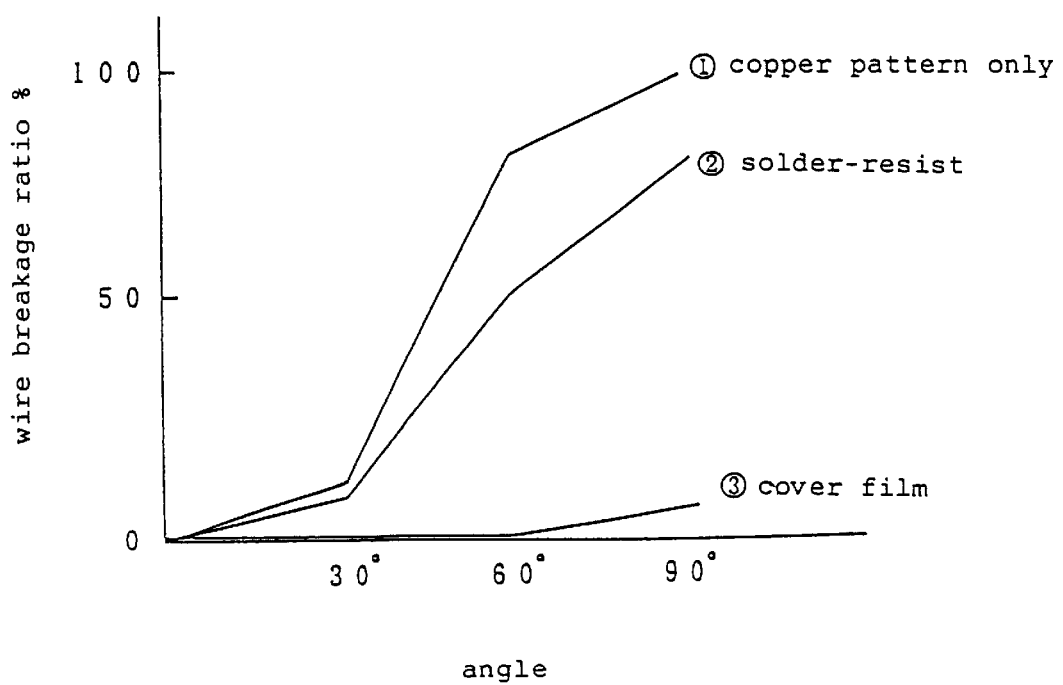
FIG. 4 is a graph showing the relation between the bending angle of printed wiring boards and the cut-wire rate.
Figure 5:
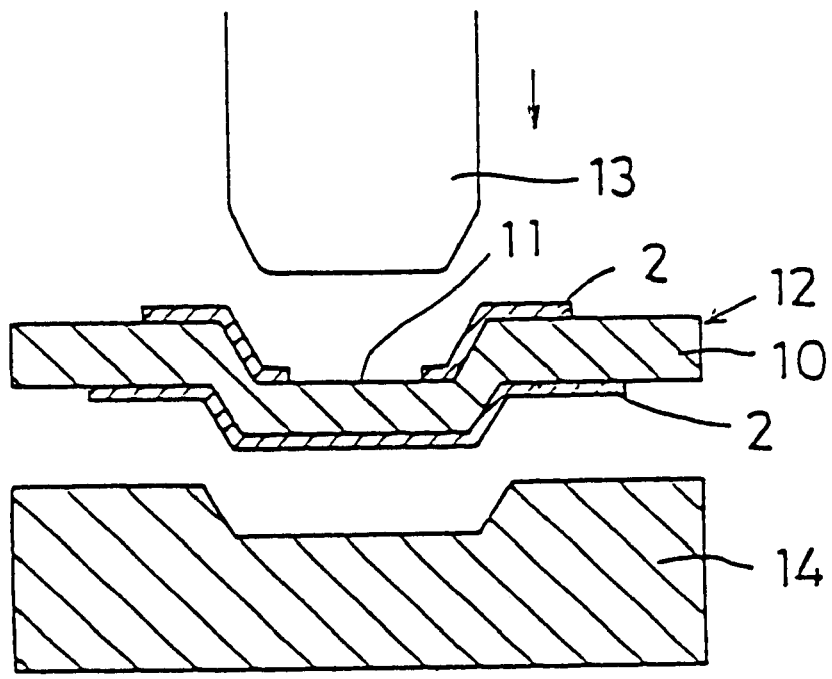
FIG. 5 is a schematic view showing a conventional method of manufacturing a three-dimensional printed wiring board.
Figure 6:
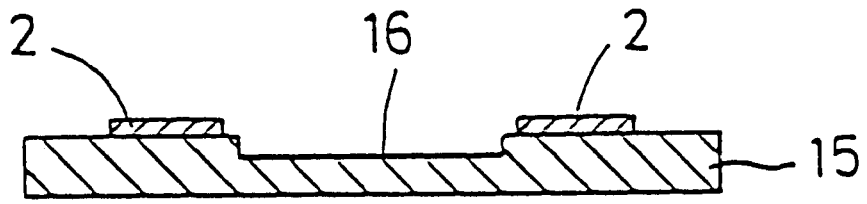
FIG. 6 is a schematic view showing another conventional manufacturing method.

The test results shown in FIG. 4 show the cut-wire rates for a board ① having no protective film covering conductor circuits (copper pattern only), for a board ② formed with an ordinary solder-resist (solder-resist), and for a board ③ having a protective film of the same resin composition as the insulating layer (cover film), when single-faced boards formed with the same circuit patterns of the same thickness were bent to 30°, 60° and 90° under the heat-press conditions of 10 minutes at 240° C.

As will be apparent from FIG. 4, while in the case of wiring boards ①, ②, for 60% or more of the printed wiring boards, wires were cut at bending at 60° or over, for most of the printed wiring boards ③ having a protective film, wires did not break until 90°.

From these results, apparently the printed wiring boards provided with a protective film covering the conductor circuits have an advantage of preventing cutting of wires by reducing stress on wiring deformed by bending.

Next, description will be made about thermal property of the filmy insulator after heat fusion of the conductive foil, which is an important control factor in the present invention. This thermal property is that the relation between the crystal-melting calorie $\Delta Hm$ and the crystallizing calorie $\Delta Hc$ produced by crystallization while the temperature is increasing satisfies the relation expressed by the formula (I).

Such a thermal property can be calculated by the above formula from measured values of two heats of transition that appear on DSC curves when the temperature is increased for differential scanning calorie measurement under JIS K7121 and K7122, crystal-melting calorie $\Delta Hm$ (J/g) and crystallizing calorie $\Delta Hc$ (J/g).

While the value of the formula (I) depends on the kind and molecular weight of the material polymers and the content ratio of the composition, forming and working conditions of the filmy insulator have a large influence thereon. That is to say, it is possible to reduce the value of the above formula by quickly cooling the material polymer after the polymer has been melted to form into a film. Also, these values can be controlled by adjusting the heat history applied during each step. Heat history herein used means the temperature of the filmy insulator and the time during which it was at that temperature. The higher the temperature, the greater the value tends to be.

The relation expressed in formula (I) is based on measurement before hot-pressing for the blank board for printed wiring after a conductive film has been heat-fused to at least one side of the filmy insulator in the steps of manufacturing the printed wiring board.

If the value expressed by formula (I) is higher than 0.5 before heat treatment such as hot pressing, since the thermoplastic resin composition is already in a high crystallizability, the shapes of the recesses formed by hot pressing will not conform to the mold shapes. Thus, it becomes necessary to carry out heat treatment such as hot pressing at a high temperature exceeding 250° C., so that the manufacturing efficiency lowers.

The thermal property that the filmy insulator has soldering heat resistance is to satisfy the relation of the formula (II) after formation of recesses. This is because it is considered that if the value of formula (II) is lower than 0.7, crystallization of the insulating layer is not sufficient to maintain soldering heat resistance (usually 260° C.

$$[(\Delta Hm - \Delta Hc)/\Delta Hm] \geq 0.7 \tag{II:}$$

The filmy insulator is usually one having a thickness of 25–300 μm, e.g. 25 μm, 50 μm, 100 μm or 200 μm. As its manufacturing method, a known film-forming method such as extrusion casting using a T-die or a calender method can be employed. But the method is not limited. From a viewpoint of film-formability and stable productivity, it is preferable to employ the extrusion casting using a T-die. The forming temperature in the extrusion casting is adjusted depending on the flow and film-forming properties of the composition. But it is above the melting point of the composition and less than 430° C.

In this invention, the polyaryl ketone resin, which is the first component forming the filmy insulator, is a thermoplastic resin containing an aromatic nucleus bond, ether bond and ketone bond as its structural units. That is to say, it is a heat-resistant, crystalline polymer having a combined structure of phenyl ketone and phenyl ether.

As representative examples of polyaryl ketone resin, there are polyether ketone, polyether-ether ketone, polyether ketone-ketone, etc. In this invention, polyether-ether ketone expressed by the chemical formula 1 is the most preferable.

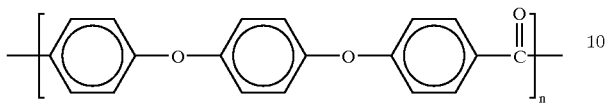

The amorphoyuse polyether imide resin, which is the second component forming the filmy insulator, is an amorphous thermoplastic resin containing an aromatic nucleus bond, ether bond and imide bond as its structural units. In this invention, the polyether imide resin expressed by the chemical formula 2 can be used.

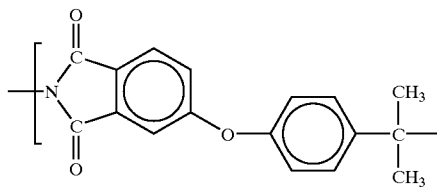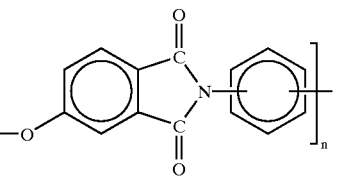

The filmy insulator used in this invention comprises a composition in which the above two kinds of thermoplastic resins are blended at a predetermined ratio. The thermoplastic resin composition comprises 65–35 wt % of a polyaryl ketone resin having a crystal-melting peak temperature of 260° C. or over, and 35–65 wt % of an amorphous polyether imide resin, and has a glass transition temperature as measured when the temperature is increased for differential scanning calorie measurement of 150–230° C.

The reason why the blend ratio is limited to the above range is because if the polyaryl ketone resin is added in a larger amount than 65 wt %, or if the content of the polyether imide resin is less than 35 wt %, the crystallizing speed of the composition would become too fast, so that the heat-fusability with the conductive foil lowers. If the crystalline polyaryl ketone resin is less than 35 wt %, or the amorphous polyether imide resin exceeds 65 wt %, the crystallinity of the composition would decrease, so that the soldering heat resistance decreases even if the crystal-melting peak temperature is 260° C. or over.

To the resin composition forming the filmy insulator used in this invention, other additives such as resins may be added. As specific examples thereof, heat stabilizers, ultraviolet absorbers, light stabilizers, colorants, lubricants, flame retardants, inorganic fillers, etc can be cited. Also, to the surface of the filmy insulator, embossing or corona treatment may be applied to improve handling property.

As the conductive foil used in this invention, a metallic foil having a thickness of 8–70 $\mu$m such as copper, gold, silver, aluminum, nickel and tin can be cited. Among them, a copper foil having its surface subjected to chemical conversion coating such as black oxiding is preferable. As the conductor foil, it is preferable to use one having its contact surface (superposed surface) with the filmy insulator roughened beforehand chemically or mechanically. As an example of the conductor foil having its surface roughened, a roughened copper foil can be named which is electrochemically treated when an electrolytic copper foil is manufactured.

EXAMPLES AND COMPARATIVE EXAMPLES

Description is made hereinbelow about the manufacturing examples 1–3 of filmy insulator that satisfy the conditions for the filmy insulator of this invention, and comparative examples 1, 2 for comparison therewith, and their physical properties.

Manufacturing Example 1 of Filmy Insulating Member 60 wt % of polyether-ether ketone resin (PEEK 381G, made by Victolex )(in the following description and Tables 1 and 2, it is abbreviated to PEEK) and 40 wt % of polyether imide resin (Ultem-1000 made by General Electric)(in the following description and Tables 1 and 2, it is abbreviated to PEI) were dry-blended. This mixed composition was formed by extrusion into a filmy insulator having a thickness of 25 $\mu$m.

Manufacturing Example 2

Except that the blend rate of the mixed composition was 40 wt % of PEEK and 60 wt % of PEI, a filmy insulator was manufactured in the same manner as in the Example 1.

Manufacturing Example 3

Except that the blend rate of the mixed composition was 30 wt % of PEEK and 70 wt % of PEI, a filmy insulator was manufactured in the same manner as in Example 1.

Reference Examples 1 and 2

Except that the blend rate of the mixed composition was 100 wt % of PEEK (reference example 1) and 100 wt % of PEI (reference example 2), a filmy insulator was manufactured in the same manner as in Example 1.

In order to examine the physical properties of the filmy insulator obtained in the Manufacturing Examples and Comparative Examples, for the items (1) and (2) shown below, values were measured or calculated from measured values. These results are shown in Table 1.

(1) Glass Transition Temperature (°C.), Crystallizing Temperature (°C.), Crystal-melting Peak Temperature (°C.)

Under JIS K7121, using 10 mg of specimens, the above temperatures were calculated from a thermograph when the temperature was increased with the heating speed of 10° C. per minute using DSC-7 made by Perkin Elmer.

$$(\Delta Hm - \Delta Hc)/\Delta Hm \qquad (2):$$

Under JIS K7122, using 10 mg of specimens, the crystal-melting calorie $\Delta$ Hm (J/g) and the crystallizing calorie $\Delta$ Hc (J/g) were calculated from a thermograph when the temperature was increased with the heating speed of 10° C. per minute using DSC-7 made by Perkin Elmer. Then the value of the above formula was calculated.

EXAMPLE 1

Electrolytic copper foils having a thickness of 12 $\mu$m and having their surface electrochemically roughened were superposed on both sides of the filmy insulator having a thickness of 25 µm obtained in Manufacturing Example 1, and heat-fused in a vacuum atmosphere of 760 mmHg, pressing temperature of 220° C., press pressure of 30 kg/cm², and pressing time of 20 minutes to manufacture a double-sided copper-clad laminated board.

For the filmy insulator of the laminated board thus manufactured, measurements of item (2) were carried out by the same method as described above. The value of the formula is shown in Table 2.

Also, for the laminated board thus manufactured, the bond strength was measured by the method (3) described below. The result is also shown in Table 2.

Next, a printed wiring board was manufactured in which a circuit pattern was formed by the subtractive method on the copper-clad laminated board thus obtained and conductive circuits were formed by etching.

The soldering heat resistance of the printed wiring board obtained was measured by the test method of the method (4) below. The result is also shown in Table 2.

Also existence or non-existence of ply separation was examined by the method (5) below. The result is shown in Table 2.

(3) Bond Strength

Under JIS C6481 (ordinary-state peel strength), peel strengths of the copper foil of the printed wiring blank board was measured and their average value was expressed in kgf/10 cm.

(4) Soldering Heat Resistance

Under JIS C6481 (soldering heat resistance in ordinary-state), after it was floated on a solder bath of 260° C. for 10 seconds with the copper foil side of the printed wiring blank board of the test piece in contact with the solder bath, it was taken out of the bath and let to cool to room temperature. Existence or non-existence of blistered or peeled portions were visually observed to evaluate if it was good or no good.

(5) FPC was buried in an epoxy resin. Specimens for observing their sections were prepared by a precision cutting machine, and the cut surfaces were observed under a scanning electron microscope (SEM) to evaluate existence or non-existence of ply separation between the filmy insulator and the conductive circuit of copper foil.

A convex plate 4 of stainless steel formed with a disk-shaped protrusion having a height of 25 µm as shown in FIG. 1(a) was superposed on the top surface of the printed wiring board thus obtained, and with a flat surface of a flat plate 5 of stainless steel pressed on the underside of the printed wiring board, it was hot-pressed at about 230° C. under pressure of 30 kgf/cm² so that the insulating layer 1 comprising the filmy insulator will be a thermoplastic resin composition that satisfies the relation expressed by the formula (II) to manufacture a three-dimensional wiring board.

EXAMPLE 2

Except that Manufacturing Example 2 was used as the filmy insulator and the press temperature when manufacturing the copper-clad laminated board was changed to 240° C. and the press time was changed to 30 minutes, a printed wiring board was manufactured in a similar manner to Example 1. The evaluations of tests (3)–(5) are shown in Table 2. Further, a three-dimensional printed wiring board was manufactured in a similar manner to Example 1.

Comparative Example 1

Except that the press temperature was changed to 230° C. and the press time was changed to 10 minutes, a printed wiring board was manufactured in a similar manner to Example 2. The evaluations of tests (3)–(5) are shown in Table 2. Further, a three-dimensional printed wiring board was manufactured in a similar manner to Example 1.

Comparative Example 2

Except that Manufacturing Example 3 was used as the filmy insulator and the press temperature was changed to 240° C. and the press time was changed to 20 minutes, a printed wiring board was manufactured in a similar manner to Example 1. The evaluations of tests (3)–(5) are shown in Table 2. Further, a three-dimensional printed wiring board was manufactured in a similar manner to Example 1.

On the three-dimensional printed wiring board of Example 1, the protruding and recessed shape of the mold was precisely reproduced so that parts could be reliably received in the recesses. Further the bond strength of the copper-clad laminated board was, as will be apparent from the results of Table 2, as good as 1.6 kgf/10 cm. As for the results of soldering heat resistance test, no blisters and peeling were observed in the board at all. Also, in the SEM observation of the FPC after formation of conductor circuits, no ply separation was observed at all.

On the three-dimensional printed wiring board of Example 2 too, the convex and concave shape of the mold was precisely reproduced and a three-dimensional printed wiring board was obtained in which the parts were reliably accommodated in the recesses. Also, the bond strength of the laminated board having both sides copper-clad was as good as 1.4 kgf/10 cm, and the result of the soldering heat resistance test was good too. Also, in the SEM observation after formation of conductive circuits by etching, no ply separation was observed at all.

In contrast, for Comparative Examples 1 and 2, on three-dimensional printed wiring board, the convex and concave shape of the mold was almost precisely reproduced, and in Comparative Example 1, there was a good adhesion between layers in the SEM observation. But for the soldering heat resistance, blisters and peeling on the board were observed and the results were no good.

Also, for the printed wiring board of Comparative Example 2, the bond strength of the laminated board having both sides copper-clad was as bad as 0.2 kgf/10 cm. After formation of conductive circuits by etching, copper foil at the circuit portion peeled.

Effect of the Invention

In the method of manufacturing a three-dimensional printed wiring board of this invention, as described above, because a conductor foil is superposed on the surface of a filmy insulator comprising a predetermined thermoplastic resin composition and is heat-fused under predetermined conditions to adjust the crystal state of the thermoplastic resin composition, the conductor foil can be reliably heat-fused to the polyimide resin-family board at a relatively low temperature. Also, no residual stress remains in the wiring board that has been deformed by bending or hot-pressed to make it three-dimensional. Thus, there is an advantage that a strain-free three-dimensional wiring board can be manufactured.

In particular, in a case where a printed wiring board is hot-pressed with a mold pressed against a required portion, hot-press forming is possible in which the convex and concave shape of the mold is precisely reproduced at a relatively low temperature of less than 250° C., preferably around 230° C. Thus, it is possible to manufacture a three-dimensional printed wiring board in which the bond strength between the insulating layer and the conductor circuits is good and no residual stress remains in the wiring board after formation so that there is no strain in the board.

In the case in which a printed wiring board formed with conductor circuits is subjected to predetermined heat treatment, it is possible to efficiently manufacture a three-dimensional wiring board which has a sufficient soldering heat resistance to withstand 260° C., and which also has good chemical resistance and electrical properties.

Furthermore, in the manufacturing method of a three-dimensional wiring board in which a protective film covering the conductor circuits is formed, even if bending work is carried out after formation of the conductor circuits, the conductors are less likely to suffer cutting.

TABLE 1

| | | Number | | | |
|---|---|---|---|---|---|
| | Ref. | manufacturing example | | | Ref. |
| Property | ex. 1 | 1 | 2 | 3 | ex. 2 |
| Content PEEK | 100 | 60 | 40 | 30 | 0 |
| (wt %) PEI | 0 | 40 | 60 | 70 | 100 |
| (1) Glass transition temp. (° C.) | 139 | 166 | 186 | 192 | 216 |
| Crystallization temp. (° C.) | 170 | 214 | 248 | 249 | — |
| Crystal-melt peak temp. (° C.) | 343 | 342 | 341 | 340 | — |
| (2) ΔHm (J/g) | 48 | 30.4 | 15.7 | 14.4 | — |
| ΔHc (J/g) | 29 | 22.5 | 15.3 | 13.8 | — |
| (ΔHm-ΔHc)/ΔHm | 0.40 | 0.26 | 0.03 | 0.04 | — |

TABLE 2

| | Number | | | |
|---|---|---|---|---|
| | Example | | Com. example | |
| Property | 1 | 2 | 1 | 2 |
| Content PEEK | 60 | 40 | 40 | 30 |
| (wt %) PEI | 40 | 60 | 60 | 70 |
| hot-press temp. (° C.) | 220 | 240 | 230 | 240 |
| hot-press time (min.) | 20 | 30 | 10 | 20 |
| (2) (ΔHm-ΔHc)/ΔHm | 0.97 | 0.94 | 0.61 | 0.65 |
| (3) Bond strength (Kgf/10 cm) | 1.6 | 1.4 | 0.8 | 0.2 |
| (4) Soldering heat resistance | good | good | bad | bad |
| (5) Ply peeling in SEM | no | no | no | yes |

What is claimed is:

1. A method of manufacturing a three-dimensional printed wiring board, said method comprising the steps of providing a filmy insulator comprising a thermoplastic resin composition containing 65–35 wt % of a polyaryl ketone resin having a crystal-melting peak temperature of 260° C. or over, and 35–65 wt % of an amorphous polyetherimide resin, and having a glass transition temperature as measured when the temperature is increased for differential scanning calorie measurement of 150–230° C., superposing a conductor foil on one or both sides of said filmy insulator, heat-fusing said conductor foil so that said thermoplastic resin composition will satisfy the relation between the crystal-melting calorie Δ Hm and the crystallizing calorie Δ Hc as expressed $((\Delta Hm-\Delta Hc)/\Delta Hm) \leq 0.5$, etching said conductor foil to form a conductor circuit, and deforming the printed wiring circuit obtained three-dimensionally.

2. The method of manufacturing a three-dimensional printed wiring board as claimed in claim 1 wherein a protective film is provided to cover said conductor circuit before deforming said printed wiring board to make it three-dimensional.

3. The method of manufacturing a three-dimensional printed wiring board as claimed in claim 1, wherein the printed wiring board formed with the conductor circuit is subjected to heat treatment so that said thermoplastic resin composition will satisfy the relation expressed by the following formula (II):

$$[(\Delta Hm-\Delta Hc)/\Delta Hm] \geq 0.7 \tag{II}$$

4. The method of manufacturing a three-dimensional printed wiring board as claimed in claim 3 wherein said heat treatment is hot-press forming.

5. The method of manufacturing a three-dimensional printed wiring board as claimed in claim 1 wherein said conductor foil laminated on one or both sides of said filmy insulator has its surface roughened.

6. The method of manufacturing a three-dimensional printed wiring board as claimed in claim 1 wherein said polyaryl ketone resin is a polyetherether ketone resin.

* * * * *